United States Patent
Pramanick et al.

(10) Patent No.: US 6,369,429 B1
(45) Date of Patent: Apr. 9, 2002

(54) LOW RESISTANCE COMPOSITE CONTACT STRUCTURE UTILIZING A REACTION BARRIER LAYER UNDER A METAL LAYER

(75) Inventors: Shekhar Pramanick, Fremont; Ming-Ren Lin, Cupertino; Qi Xiang, Santa Clara, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/641,727

(22) Filed: Aug. 21, 2000

Related U.S. Application Data

(62) Division of application No. 09/187,520, filed on Nov. 6, 1998, now Pat. No. 6,165,902.

(51) Int. Cl.[7] ............................................. H01L 23/52
(52) U.S. Cl. ...................... 257/382; 257/764; 257/751; 257/766
(58) Field of Search ................................ 257/764, 751, 257/766, 382, 383, 384

(56) References Cited

U.S. PATENT DOCUMENTS

| | | | |
|---|---|---|---|
| 4,141,022 A | * | 2/1979 | Sigg et al. |
| 4,206,472 A | * | 6/1980 | Chu et al. |
| 5,202,287 A | | 4/1993 | Joshi et al. |
| 5,567,651 A | * | 10/1996 | Berti et al. |
| 5,654,570 A | | 8/1997 | Agnello |
| 5,807,788 A | | 9/1998 | Brodsky et al. |
| 5,904,564 A | | 5/1999 | Park |
| 5,998,873 A | * | 12/1999 | Blair et al. |
| 6,008,124 A | * | 12/1999 | Sekiguchi et al. |
| 6,025,634 A | * | 2/2000 | Teong |
| 6,072,222 A | * | 6/2000 | Nistler |
| 6,255,701 B1 | * | 7/2001 | Shimada |

OTHER PUBLICATIONS

C. S. Wei et al., "The Use of Selective Electroless Metal Deposition for Micron Size Contact Fill," Technical Digest of the 1988 International Electron Devices Meeting, pp. 446–449, Dec. 1988.*
D. Hisamoto et al., "Metallized Ultra–Shallow–Junction Device Technology for Sub–0.1 um Gate MOSFETs," IEEE Transactions on Electron Devices, vol. 41, pp. 745–750, May 1994.*

* cited by examiner

*Primary Examiner*—Charles Bowers
*Assistant Examiner*—Stephen W. Smoot

(57) ABSTRACT

Low resistance contacts are formed on source/drain regions and gate electrodes by selectively depositing a reaction barrier layer and selectively depositing a metal layer on the reaction barrier layer. Embodiments include selectively depositing an alloy of cobalt and tungsten which functions as a reaction barrier layer preventing silicidation of a layer of nickel or cobalt selectively deposited thereon. Embodiments also include tailoring the composition of the cobalt tungsten alloy so that a thin silicide layer is formed thereunder for reduced contact resistance.

18 Claims, 3 Drawing Sheets

LOW RESISTANCE COMPOSITE CONTACT STRUCTURE UTILIZING A REACTION BARRIER LAYER UNDER A METAL LAYER

This is a divisional application of U.S. application Ser. No. 09/187,520 filed on Nov. 6, 1998, now U.S. Pat. No. 6,165,902.

This application contains subject matter related to subject matter disclosed in copending U.S. patent application Ser. No. 09/106,769 filed on Jun. 30, 1998, now U.S. Pat. No. 6,015,752 issued Jan. 18, 2000; Ser. No. 09/323,818 filed on Jun. 2, 1999 and now U.S. Pat. No. 6,083,817; and Ser. No. 09/187,552 filed on Nov. 6, 1998 and now abandoned.

TECHNICAL FIELD

The present invention relates to semiconductor manufacturing, particularly to self-aligned low resistance contact technology. The present invention is particularly applicable to manufacturing ultra large scale integrated circuit (ULSI) systems having features in the deep-submicron range.

BACKGROUND ART

Deep-submicron scaling required for ULSI systems dominates design considerations in the microelectronics industry. As the gate electrode length is scaled down, the source and drain junctions must be scaled down accordingly, to suppress the so-called short channel effects (SCE) which degrade performance of miniaturized devices. A major problem related to complementary metal oxide silicon (CMOS) scaling is the undesirable increase in parasitic resistance. As the source/drain junction depth ($X_j$) and polycrystalline silicon line width are scaled into the deep-submicron range, parasitic series resistances of the source/drain diffusion layers and polysilicon gate electrodes increase. A conventional approach to the increase in parasitic series resistances of the source/drain diffusion layers and the polysilicon gate electrodes involves salicide technology which comprises forming a layer of titanium silicide ($TiSi_2$) on the source/drain regions and gate electrode.

Conventional salicide technology employing $TiSi_2$ for reducing parasitic series resistance has proven problematic, particularly as design rules plunge into the deep-submicron range, e.g., about 0.18 microns and under. For example, in forming a thin $TiSi_2$ layer, silicide agglomeration occurs during silicide annealing to effect a phase change from the high resistivity C49 form to the low resistivity C54 form. Such agglomeration further increases the sheet resistance of the silicide film. Moreover, the formation of a thick silicide layer causes a high junction leakage current and low reliability, particularly when forming ultra-shallow junctions, e.g., at an $X_j$ of less than about 800 Å. The formation of a thick silicide consumes crystalline silicon from the underlying semiconductor substrate such that the thick silicide layer approaches and even shorts the ultra-shallow junction, thereby generating a high junction leakage current.

Another problem attendant upon conventional $TiSi_2$ technology is the well-known increase in sheet resistance as the line width narrows. The parasitic series resistances of source/drain regions and gate electrodes are a major cause of device performance degradation and are emerging as one of the severest impediments to device scaling.

There are additional problems attendant upon conventional silicide technology employing titanium or other metals, such as cobalt, which problems are exacerbated as design rules extend into the deep-submicron range, e.g. about 0.18 microns and under. For example, conventional salicide technology for deep-submicron CMOS transistors comprises depositing a layer of the metal at a predetermined thickness by physical vapor deposition (PVD), such as sputtering, over the entire wafer surface and then conducting a two step rapid thermal annealing with an intervening etching step to remove unreacted metal from the dielectric sidewall spacers on the gate electrode as well as the field isolation region. The need to remove unreacted metal from the dielectric sidewall spacers and field isolation region complicates processing and reduces manufacturing throughput as well as device reliability. In addition, as devices are scaled smaller and smaller, shorting between source/drain regions and the gate electrode becomes significant due to high temperature processing required to form low resistivity silicide layers.

Cobalt salicide technology involves additional drawbacks in the propensity to cause drain junction leakage resulting in unacceptable high power dissipation and functional failure. This problem becomes particularly critical as gate lengths are scaled down below 0.25 microns and source/drain junctions are reduced. Junction leakage is attributable, at least in part, to the irregular interface formed between a cobalt silicide layer and the silicon substrate, which results in a non uniform and insufficient distance between portions of the bottom of the cobalt silicide layer and source/drain junctions.

Consequently, when a junction is biased, a depletion region is formed which extends on either side of the junction. Since the distance the depletion region spreads from the junction is inversely proportional to doping, the depletion regions spreads mainly into the substrate. If the cobalt silicide extends into the depletion spread, leakage can occur. Moreover, the thickness of a cobalt silicide layer is typically about three times the thickness of the deposited cobalt layer, which results in high consumption of underlying silicon during silicidation.

Accordingly, while conventional salicide technology is directed to forming low resistance contacts to source/drain regions and low resistance silicided polycrystalline lines for complementary metal oxide semiconductor (CMOS) devices, the silicide thickness must be reduced in order to avoid junction leakage attendant upon the reduction in source/drain junction depths due to increased miniaturization. However, thin silicide layers exhibit higher sheet resistance. Moreover, it is very difficult to form a thin planar silicide layer due to inherent high surface energy which is attributed to the large surface area to volume ratio. The high sheet resistance of ultra thin silicide layers exhibits a significant detrimental impact on transistor speed. In order to reduce parasitic resistance and obtain high speed (low transistor delay), it is desirable to lower the resistance of the metal lines.

Accordingly, there exists a need for simplified technology which enables a reduction in parasitic series resistance without causing junction leakage. There exist a particular need for simplified methodology for forming low resistance contacts in semiconductor devices having a design rule less than about 0.18 microns with increased reliability, reduced junction leakage and high transistor speed.

DISCLOSURE OF THE INVENTION

An advantage of the present invention is a method of manufacturing a semiconductor device having low resistance contacts with virtually no consumption of underlying silicon.

Another advantage of the present invention is a semiconductor device comprising low resistance contacts, reduced parasitic sheet resistance and reduced junction leakage.

Additional advantages and other features of the present invention will be set forth in part in the description which follows, and in part will become apparent to those having ordinary skill in the art upon examination of the following or may be learned by practice of the present invention. The advantages of the present invention may be realized and attained as particularly pointed out in the appended claims.

According to the present invention, the foregoing and other advantages are achieved in part by a method of manufacturing a semiconductor device, the method comprising: forming a structure comprising a silicon substrate; source/drain regions in the substrate with a channel region therebetween; a gate dielectric layer on the substrate over the channel region; a silicon gate electrode, having an upper surface and side surfaces, on the gate dielectric layer; and a dielectric sidewall spacer on each side surface of the gate electrode, leaving a portion of each source/drain region exposed; forming a conductive composite contact layer on the exposed portion of each source/drain region and on the upper surface of the gate electrode, each conductive composite contact layer comprising: a lower reaction barrier layer, and a metal layer on the reaction barrier layer. Embodiments include selectively depositing a reaction barrier layer comprising an alloy of cobalt and tungsten and selectively depositing a nickel or cobalt layer on the reaction barrier layer. Embodiments also include tailoring the cobalt tungsten alloy so that a thin silicide layer is formed under the reaction barrier layer for low contact resistance, while the reaction barrier layer prevents silicidation of the overlying nickel or cobalt.

Another aspect of the present invention is a semiconductor device comprising: a silicon substrate; source/drain regions in the substrate with a channel region therebetween; a gate dielectric layer on the substrate over the channel region; a silicon gate electrode, having an upper surface and side surfaces, on the gate dielectric layer, a dielectric sidewall spacer on each side surface of the gate electrode, leaving a portion of each source/drain region exposed; and a conductive composite contact layer on each exposed source/drain regions and on the upper surface of the gate electrode, each conductive composite contact layer comprising: a lower reaction barrier layer, and a metal layer on the reaction barrier layer. Embodiments include selectively deposited conductive composite contact layers each comprising a cobalt tungsten alloy reaction barrier layer and a nickel or cobalt layer thereon, with or without a silicide layer underlying the cobalt tungsten reaction barrier layer.

Additional advantages of the present invention will become readily apparent to those skilled in the art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION THE INVENTION

Figure 1:
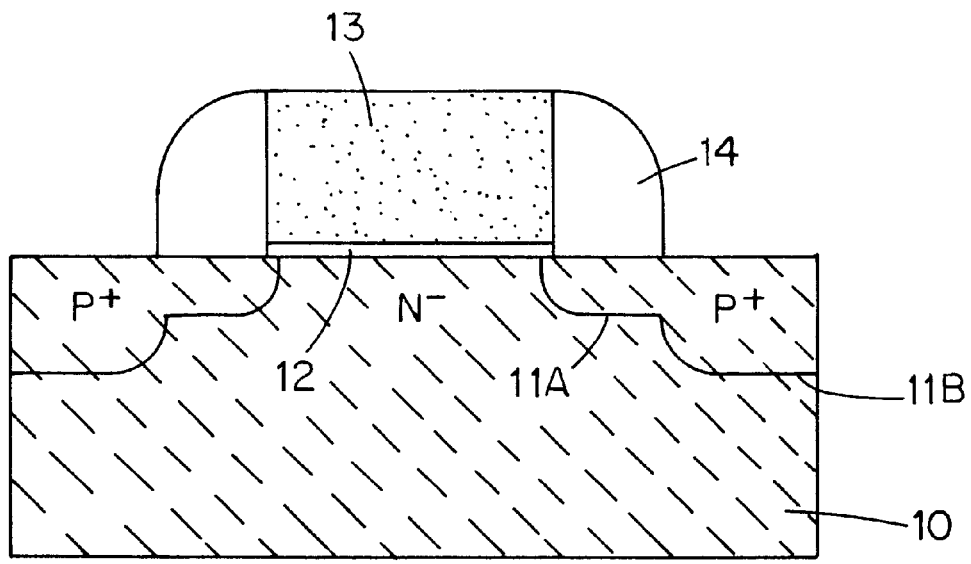
FIGS. 1–3 schematically illustrate sequential phases of conventional salicide methodology.

The present invention addresses and solves problems attendant upon conventional salicide *; technology for reducing parasitic series resistances. Conventional salicide methodology comprises depositing a layer of metal, such as titanium of a predetermined-thickness, by physical vapor deposition over the entire surface of the wafer. Subsequently, an initial rapid thermal annealing is conducted, as at a temperature of about 600° C. to about 725° C., during which titanium reacts with underlying silicon to form the high resistivity C49 phase of titanium silicide. Etching is then conducted to remove unreacted titanium from the dielectric sidewall spacers on the gate electrode and on the field isolation region. A second rapid thermal annealing step is then preformed, as at a temperature of about 780° C. to about 900° C., to convert the high resistivity C49 phase to the low resistivity C54 phase of titanium silicide. The necessity to remove unreacted titanium from the dielectric sidewall spacers and field isolation region complicates processing and reduces manufacturing throughput and device reliability. Moreover, the relatively high temperature rapid thermal annealing required to form the low resistivity C54 phase of titanium silicide causes shorting between the source/drain regions and gate electrode, particularly as devices are scaled into the deep submicron range.

The objective of providing low resistance contacts to source/drain regions and low resistance silicide polycrystalline silicon gate electrode for CMOS devices is difficult to satisfy, in that the requisite thickness for such silicide layers must be controlled to avoid junction leakage due to the reduced source/drain junction depths required by current miniaturization demands. Thin silicide layers exhibit high sheet resistance and are difficult to form with a uniform surface. Thus, conventional silicide technology cannot satisfy the increasing demands for high speed miniaturized integrated circuitry.

The present invention addresses and solves such problems by providing technology enabling the formation of low resistance contacts to the source/drain regions and the polycrystalline silicon gate at a suitable thickness to reduce parasitic resistance series resistances while achieving optimum junction leakage characteristics. These competing objectives in conventional methodology are satisfied in the various embodiments of the present invention by forming the low resistance contacts with no or virtually no silicon consumption of the underlying substrate or gate electrode. Embodiments of the present invention include forming a conductive, low resistance, composite contact layer on the source/drain regions and polycrystalline gate electrode, which conductive composite contact layer comprises a lower reaction barrier layer and an overlying metal layer. The lower reaction barrier layer prevents reaction of the overlying metal with silicon.

Embodiments of the present invention comprise selectively depositing, as by electroless plating, a metallic reaction barrier layer on the source/drain regions and gate electrode, and subsequently selectively depositing a metal layer on the reaction barrier layer. For example, an alloy, such as a cobalt-tungsten alloy, is initially selectively electrolessly deposited on the source/drain regions and gate electrode, followed by selectively electrolessly depositing a nickel or cobalt layer on the cobalt tungsten barrier layer. The cobalt alloy layer can contain about 0.5 at. % tungsten or more, such as up to about 10 at. % tungsten, e.g., about 2 at. % tungsten. The amount of tungsten is selected such that the cobalt tungsten alloy is inert with respect to silicon and, hence, prevents reaction of silicon with the overlying nickel or cobalt layer.

Embodiments of the present invention also include formulating the cobalt-tungsten alloy such a minor amount of silicidation occurs to form a thin silicide layer underlying the reaction barrier layer, e.g., cobalt-silicide, for low contact resistance. For example, upon spike heating (less than 5 seconds) at less than 650° C., a thin cobalt silicide layer forms underlying the cobalt-tungsten alloy, such as at a thickness up to about 200 Å, e.g. between 50 Å and 100 Å.

Embodiments of the present invention include selectively depositing a cobalt-tungsten layer having a thickness of about 100 Å to about 500 Å and selectively depositing a nickel or cobalt layer at a thickness of about 500 Å to about 1500 Å on the cobalt tungsten alloy layer. The resulting sheet resistance of the selectively deposited composite contact layer is relatively low, e.g. about 0.1 to about 4 ohmns per square.

Advantageously, in accordance with embodiments of the present invention, there is no or extremely little consumption of silicon from the underlying substrate or gate electrode. Thus, the composite contact layers can be formed at an optimum thickness to reduce parasitic series resistance, e.g., about 500 Å to about 1500Å, while enabling the attainment of ultra-shallow junction depths, e.g., less than 800 Å, even less than 500 Å, without encountering junction leakage. The present invention enjoys utility in manufacturing any of various types of semiconductor devices, particularly advanced deep-submicron CMOS devices, such as 0.1 microns devices with ultra-shallow junctions.

In accordance with the present invention, the substrate typically comprises crystalline silicon, e.g., monocrystalline silicon. The substrate can either be a p-substrate or an n-substrate, with the source/drain regions having a conductivity type opposite to that of the substrate.

Figure 2:
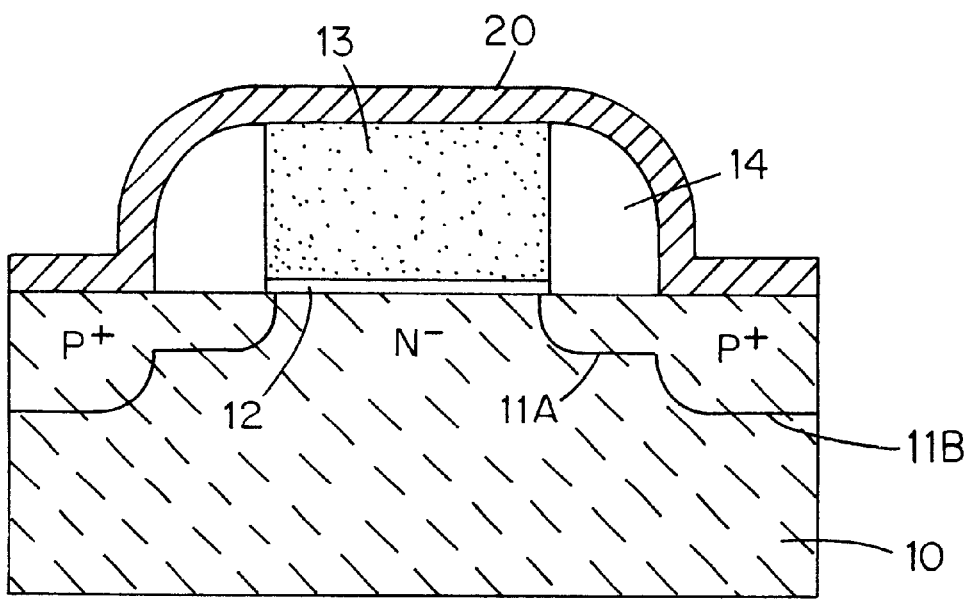
Figure 3:
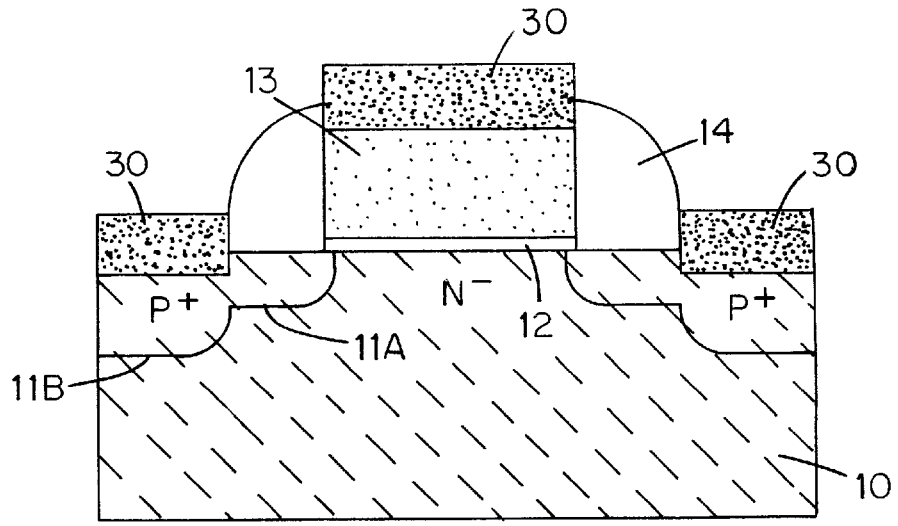
Figure 4:
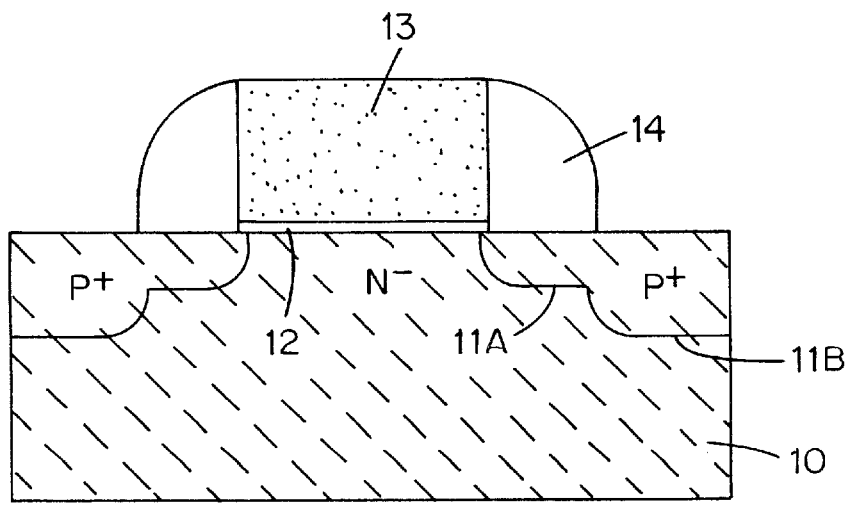
FIGS. 4 and 5 schematically illustrate sequential phases in accordance with an embodiment of the present invention.
Figure 5:
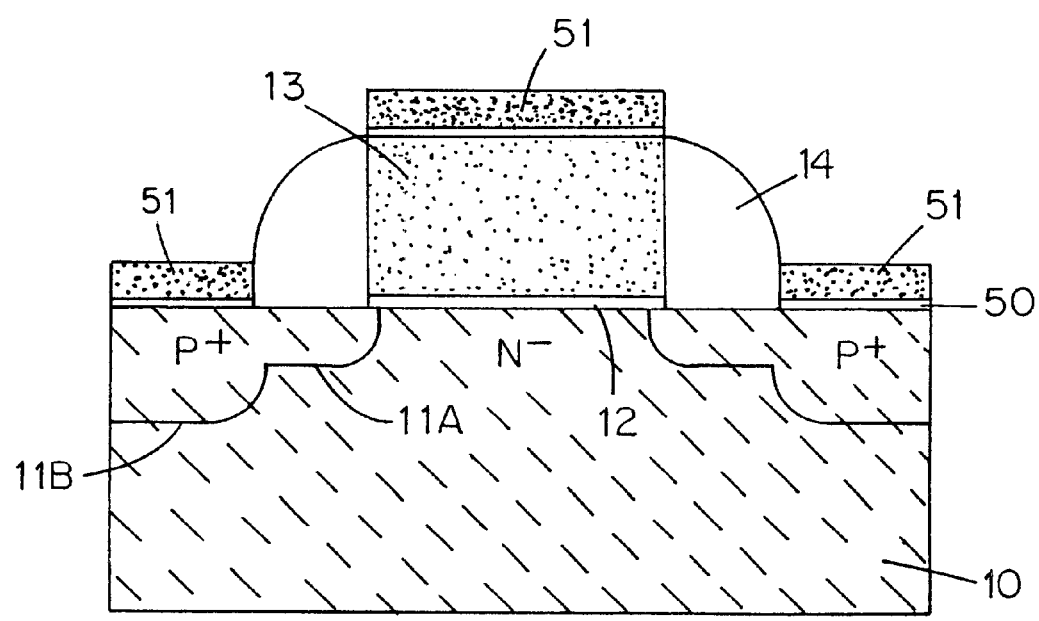

The advantages of the present invention vis-a-vis conventional practices can be appreciated by comparing conventional salicide methodology, illustrated in FIGS. 1–3, to an embodiment of the present invention which is illustrated in FIGS. 4 and 5. In FIGS. 1–5, similar reference numerals denote similar features.

Adverting to FIG. 1, a conventional transistor structure, formed in a conventional manner, comprises substrate 10 doped with an n-type impurity, and source/drain regions comprising a shallow extension region 11A and a heavily doped (HD) region 11B doped with a p-type impurity. The source/drain regions are formed in a conventional manner as, for example, by forming gate electrode layer 13 on semiconductor substrate 10 with gate dielectric layer 12, e.g., a gate oxide such as silicon dioxide, therebetween. Using the gate electrode as a mask, shallow extension regions 11A are formed by ion implantation. Dielectric sidewall spacers 14 are then formed on the side surfaces of gate electrode 13 and ion implantation is conducted to form HD regions 11B.

Adverting to FIG. 2, a layer of metal 20, such as titanium, is sputter deposited over the entire wafer surface including on dielectric sidewall spacers 14 and on the field isolation region (not shown). An initial rapid thermal annealing is then conducted to form the high resistivity C49 phase of titanium silicide on the source /drain regions and gate electrode, leaving unreacted titanium 20 on the dielectric sidewall spacers 14 and field isolation region (not shown). Adverting to FIG. 3, unreacted titanium 20 on the dielectric sidewall spacers 14 and field isolation region (not shown) are then removed, as by etching. Subsequently, a second rapid thermal annealing heating is conducted, e.g., at a temperature of about 780° C. to about 900° C., to form the low resistivity C54 phase of titanium silicide 30 on the source/drain regions and gate electrodes.

The above conventional salicide technology is complicated by the need to remove unreacted titanium from the dielectric sidewall spacers and field isolation region. Moreover, as devices are scaled into the deep submicron range, high temperature annealing to form the low resistivity metal silicide phase generates shorting between the source/drain regions and gate electrode. In addition, the demands for miniaturization and ultra-shallow junctions depth conflicts with the need for sufficiently thick silicide layers to reduce parasitic series resistance. These problems are overcome by the present invention.

Adverting to FIG. 4, a conventional transistor structure is illustrated which corresponds to that depicted in FIG. 1 and comprises a substrate 10 doped with an n-type impurity, and source/drain regions comprising a shallow extension region 11A and HD region 11B doped with a p-type impurity. The source/drain regions are also formed in a conventional manner as, for example, by forming gate electrode layer 13 on semiconductor substrate 10 with dielectric gate dielectric layer 12, e.g., a gate oxide such as silicon dioxide, therebetween. Employing the gate electrode as a mask, shallow extension regions 11A are formed by ion implantation. Dielectric sidewall spacers 14 are then formed on the side surfaces of gate electrode 13. Dielectric sidewall spacers can comprise any suitable dielectric material, such as silicon dioxide, silicon nitride or a composite of silicon dioxide and silicon nitride or even a low dielectric constant material with a K value as low as 1.5. Ion implantation is then conducted, using gate electrode 13 and sidewall spacers 14 as a mask, to form HD regions 11B.

Adverting to FIG. 5, a cobalt-tungsten alloy layer 50 is selectively deposited on the exposed portions of the source/drain regions, i.e., on the HD region 11B, and on gate electrode 13. The deposited cobalt-tungsten alloy can contain up to about 10 at. % phosphorus, boron, or both, depending upon the plating bath employed. The selective deposition of cobalt-tungsten alloy layers 50 can be effected in any conventional manner. Advantageous results have been obtained by selectively depositing cobalt-tungsten alloy layers 50 on the exposed portions of the HD regions 11B and on the upper surface of gate electrode 13, by electroless plating. Such selective electroless plating can be implemented by initially removing any oxide film from the main surface of the semiconductor substrate, i.e., the upper surfaces of the HD regions 11B, and from the upper surface of gate electrode 13, as with a buffered oxide etch (BOE) at room temperature for about 30 seconds. The surfaces of the source/drain regions and gate electrode are then activated employing a solution of palladium chloride, hydrochloric acid (HCl) and BOE, e.g. 0.25 g palladium chloride/liter, 10 milliliters (HCl)/liter and 25 milliliters of a 10:1 BOE. The activated surface is then rinsed for about three minutes employing about 10 milliliters of HCl/liter, about 25 milliliters of a 10:1 BOE/liter and about 50 mg/liters of Rhodafac RE610, an anionic surfactant available from Rhone-Poulen, located in Cranberry, N.J. Electroless plating of cobalt-tungsten is then conducted employing a conventional bath composition.

A suitable catalytic activating solution comprises 0.25 g of palladium chloride/liter, 10 ml HCl/liter, 25 ml of 10:1 BOE/liter and 50 mg/liter of Rhodafac RE610. A suitable post catalytic rinse solution comprises 10 ml of HCl/liter, 25 ml of 10:1 BOE/liter and 50 mg/liter of Rhodafac RE610. A suitable electroless cobalt-tungsten plating solution comprises: 30 g/liter cobalt chloride hexahydrate, 50 g/liter ammonium chloride, 84.5 g/liter sodium citrate, with the pH adjusted to 9.5 with ammonium hydroxide, 10 g/liter sodium tungsten oxide, 20 g/liter sodium hypophosphite dihydrate, and 50 mg/liter Rhodafac RE610. The solution is heated to 95° C. which is the operating temperature. A suitable electroless cobalt plating solution comprises 30 g/liter cobalt chloride hexahydrate, 50 g/liter ammonium chloride, 84.5 g/liter sodium citrate, with the pH adjusted to 9.5 with ammonium hydroxide; 20 g/liter of sodium hypophosphite dihydrate, and 50 mg/liter Rhodafac RE610. The solution is heated to 95° C. which is the operating temperature.

Subsequently, a layer of cobalt 51 is selectively deposited on the cobalt-tungsten alloy layer 12. Such selective deposition can also be implemented in a manner similar to the selective deposition of the cobalt-tungsten alloy layer 12. Embodiments include electroless plating Co containing up to about 10 at. % phosphorous or boron, depending upon the conventional cobalt salt employed in the plating bath.

In selectively depositing metal layers by electroless deposition, it is believed that activation of the cleaned silicon surface with palladium chloride forms palladium nucleation sites which ultimately remain. Thus, in embodiments of the present invention wherein the reaction barrier layer is formed directly on the underlying silicon, the reaction barrier layer would contain some palladium. In embodiments of the present invention wherein a thin silicide layer is formed under the reaction barrier layer, the thin silicide layer would contain a small amount of palladium remaining from the activation treatment with palladium chloride. The metal layer would also contain a small amount of palladium at the interface with the reaction barrier layer.

The present invention advantageously enables manufacturing deep-submicron CMOS devices, such as sub 0.1 micron devices, with ultra-shallow junctions less than about 800 Å, without increased parasitic series resistances in a simplified manner with increased device reliability. The present invention is applicable to the manufacture of various types of semiconductor devices, particularly semiconductor devices having a design rule less than about 0.18 microns.

In the previous description, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
   a silicon substrate;
   source/drain regions in the substrate with a channel region therebetween;
   a gate dielectric layer on the substrate over the channel region;
   a silicon gate electrode, having an upper surface and side surfaces, on the gate dielectric layer;
   a dielectric sidewall spacer on each side surface of the gate electrode, leaving a portion of each source/drain region exposed; and
   a conductive composite contact layer on each exposed source/drain region and on the upper surface of the gate electrode, each conductive composite contact layer comprising;
   a lower metallic reaction barrier layer; and
   a metal layer on the metallic reaction barrier layer.

2. The semiconductor device according to claim 1, wherein the metallic reaction barrier layer comprises an alloy of cobalt and tungsten.

3. The semiconductor device according to claim 2, wherein the metal layer comprises nickel or cobalt.

4. The semiconductor device according to claim 3, wherein the cobalt tungsten reaction barrier layer comprises an alloy of cobalt and at least about 0.5 at. % tungsten.

5. The semiconductor device according to claim 2, wherein each conductive composite contact layer further comprises a silicide layer under the cobalt tungsten reaction barrier layer.

6. The semiconductor device according to claim 5, wherein the silicide layer has a thickness less than about 200 Å.

7. The semiconductor device according to claim 6, wherein the silicide layer has a thickness less than about 100 Å.

8. The semiconductor device according to claim 2, wherein the cobalt tungsten reaction barrier layer has a thickness of about 100 Å to about 500 Å.

9. The semiconductor device according to claim 8, wherein the metal layer has a thickness of about 500 Å to about 1500 Å.

10. A semiconductor device comprising:
    a silicon substrate:
    source/drain regions in the substrate with a channel region therebetween;
    a gate dielectric layer on the substrate over the channel region;
    a silicon gate electrode, having an upper surface and side surfaces, on the gate dielectric layer;
    a dielectric sidewall spacer on each side surface of the gate electrode, leaving a portion of each source/drain region exposed; and
    a conductive composite contact layer on each exposed source/drain region and on the upper surface of the gate electrode, each conductive composite contact layer comprising;
    a lower reaction barrier layer; and
    a layer of nickel or cobalt on the reaction barrier layer.

11. The semiconductor device according to claim 10, wherein the reaction barrier layer is metallic.

12. The semiconductor device according to claim 10, wherein the metallic reaction barrier layer comprises an alloy of cobalt and tungsten.

13. The semiconductor device according to claim 12, wherein the cobalt tungsten reaction barrier layer comprises an alloy of cobalt and at least about 0.5 at. % tungsten.

14. The semiconductor device according to claim 12, wherein each conductive composite contact layer further comprises a silicide layer under the cobalt tungsten reaction barrier layer.

15. The semiconductor device according to claim 14, wherein the silicide layer has a thickness less than about 200 Å.

16. The semiconductor device according to claim 15, wherein the silicide layer has a thickness less than about 100 Å.

17. The semiconductor device according to claim 12, wherein the cobalt tungsten reaction barrier layer has a thickness of about 100 Å to about 500 Å.

18. The semiconductor device according to claim 17, wherein the nickel or cobalt layer has a thickness of about 500 Å to about 1500 Å.

* * * * *